United States Patent [19]
Derbinski et al.

[11] Patent Number: 5,820,329
[45] Date of Patent: Oct. 13, 1998

[54] VACUUM PROCESSING APPARATUS WITH LOW PARTICLE GENERATING WAFER CLAMP

[75] Inventors: Senia L. Derbinski, River Edge; Richard Fred Parker, Upper Saddle River, both of N.J.

[73] Assignee: Tokyo Electron Limited, Tokyo, Japan

[21] Appl. No.: 827,690

[22] Filed: Apr. 10, 1997

[51] Int. Cl.[6] .................................................. B65H 5/00
[52] U.S. Cl. .......................... 414/225; 269/903; 414/939
[58] Field of Search .................................... 414/225, 939; 294/110.1; 269/903, 287, 235

[56] References Cited

U.S. PATENT DOCUMENTS

| | | | |
|---|---|---|---|
| 4,311,427 | 1/1982 | Coad et al. | 414/225 X |
| 4,860,439 | 8/1989 | Riley | 269/903 X |
| 4,915,564 | 4/1990 | Eror et al. | |

Primary Examiner—Donald W. Underwood
Attorney, Agent, or Firm—Wood, Herron & Evans, L.L.P.

[57] ABSTRACT

A wafer is clamped to a wafer holder for processing with a front plane clamping ring and backplane clips without sliding or rolling contact with the wafer that would tend to increase particulate contamination. A load arm moves a semiconductor wafer, device side first, forwardly into a loading chamber, for example a loadlock, and through an opening in a wafer holder within the chamber, where the wafer contacts the underside of an annular clamping ring, which is attached to the holder body by springs, to displace the ring away in a forwardly direction from the holder. The ring is displaced, for example, sufficiently from the holder, preferably 30 to 40 thousandths of an inch or more for standard thickness semiconductor wafers, to clear a plane at the back of the holder in which lie a plurality of clips. Latch actuators on the load arm engage and rotate the clips into the opening behind the wafer when the wafer is displaced in a forward direction out of the plane. The load arm is then retracted, allowing the springs to pull the clamp ring, and thereby the wafer, backward against the clips, with no sliding or rolling contact between the clips and the wafer. Magnets in the latch assemblies that carry the clips hold the clips in place during processing so that they will remain in alignment for engagement by the actuators on the load arm during the wafer loading and unloading.

10 Claims, 4 Drawing Sheets

VACUUM PROCESSING APPARATUS WITH LOW PARTICLE GENERATING WAFER CLAMP

This invention relates to high vacuum processing and particularly the handling and holding of wafers for processing. More particularly, this invention relates to the avoidance of particulate contamination and mishandling problems in semiconductor device manufacturing processes.

BACKGROUND OF THE INVENTION

High vacuum systems are widely used in technical and commercial applications such as semiconductor device manufacturing processes, which require the performance of the particular process in the absence of air and airborne contaminants. An example of such a process is the sputter deposition of thin films onto silicon wafer substrates in the manufacture of integrated circuit chips. With the ongoing trend toward device miniaturization in semiconductor manufacture where device features are currently assuming submicron dimensions, and with integrated circuits increasing in functional size, complexity and value, the particles of sizes and in quantities that have heretofore been tolerable in semiconductor manufacture are now capable of causing damage that can totally destroy expensive devices.

In semiconductor device manufacturing applications, a high vacuum sputtering system is typically employed, which is composed of a processing chamber having a sealable port or door through which wafers are inserted for processing and removed. Wafers are transferred into the processing chambers on transfer arms that typically engage the rims of a wafers with fingers or the back sides of wafers with vacuum chucks. These wafers are translated, either edgewise or device side first, through the port or door, and handed off to a wafer holder in the processing chamber, that holds the wafer securely in place for processing. The handing off of these wafers from the transfer arm to the wafer holder involves contact between relatively moving parts, including mechanical sliding or rolling contact across the gripped surfaces of the wafer that are being found to cause the generation of particles that are increasingly regarded as unacceptably harmful to the processing of the wafers.

An example of a wafer handling and holding mechanism that has been preferred for use in the processing of wafers in the recent past is described and illustrated in U.S. Pat. No. 4,915,564 hereby expressly incorporated herein by reference. In that system, individual wafers are gripped on their back surfaces by vacuum chucks on a transfer arm and transferred device side first through the door of a loadlock chamber of a processing apparatus. The arm moves the wafer against a clamping ring carried by the wafer holder in the loadlock, whereupon a plurality of latches, three in number spaced at even intervals around the periphery of the holder, move behind the wafer to clamp the wafer between the latches and the clamping ring. To avoid sliding friction of the latches across the backs of the wafers, the latches have rollers at the tips thereof which roll onto the wafer back surface into a latching position while applying a force to the wafer that is resisted by the clamping ring. The latches are held in their latching positions by spherical spring loaded detents so that the latches do not move out of their latching positions after the loading arm chucks have disengaged the wafer and the loading arm is withdrawn from the loadlock. The detents hold the latches in position for the additional reason that the latches must be positioned for engagement by latch actuators on the loading arm when the arm is returned to the loadlock chamber to remove the wafer after processing.

With the wafer handling and holding mechanism of the prior art referred to above, any freezing of the rollers or other failure of the rollers to roll freely on the wafer surface can cause the dislodging of particles from the wafer backside. In addition, movement of the spherical detents across the surfaces of the latches can release particles of the metal of which the latches or rollers are made. Further, any minute differences in time in the contacting of the wafers with the rollers of the different latches of the plurality can cause a shifting of the wafer on the holder, which can cause particle generation or, if displacement is severe, wafer breakage. Further, friction between the detents and the latches can cause the latches to move out of their desired positions or cause the detents to fail to lock the latches in the desired positions, potentially causing latch actuator failure.

Overall, the latching mechanisms are complicated, with many moving parts, all of which have a tendency to generate particles, which, with the trend to smaller and smaller devices and device features are becoming increasingly undesirable.

Accordingly, there remains a need for a better method and apparatus for handing off wafers between transfer arms and wafer holders and for holding wafers to the wafer holders for processing. There is a particular need for providing such method and apparatus while reducing or preventing particulate generation.

SUMMARY OF THE INVENTION

It is an objective of the present invention to provide a high vacuum processing apparatus with improved wafer clamping in a processing chamber. It is another objective of the present invention to reduce the production of particles that can lead to substrate contamination in semiconductor wafer vacuum processing, particularly in the hand off of wafers between a transfer arm and a wafer holder, for example, within a chamber of a processing chamber.

According to the principles of the present invention, rolling and sliding contact between a wafer and wafer clamping structure are avoided when the clamping structure is being actuated to engage or disengage a wafer. Preferably, contact with the wafer by a wafer clamp or holder is made only by relative motion that is normal to the wafer surface at the moment of contact.

In accordance with the preferred embodiment of the invention, a wafer holder is provided with a spring biased wafer clamping ring configured to engage the device side of the wafer around the rim of the wafer. A wafer is loaded into and removed from the holder by a transfer arm moving in a direction normal to the holder, loading the wafer through an opening in the bottom of the holder, device side first. Then, through either further movement of the clamping arm or movement of the holder, the wafer is brought into contact with the underside of the clamping ring, relatively moving the ring, against the force of the biasing springs away from the holder, by at least thirty or forty thousandths of an inch, without the occurrence of any sliding of the wafer against the clamp ring or any other surface. When the clamp ring is displaced, latch clips, engaged by an actuator on the transfer arm, are rotated by rotation of the actuator to positions behind the wafer. The wafer has moved, relative to the holder, through and beyond the plane of the batch clips at least enough to provide reliable clearance between the back of the wafer and the clips so that the clips rotate without touching the wafer which is positioned sufficiently beyond the path of the clips. When the clips are rotated into position, the transfer arm is retracted and the wafer is pressed into contact with the clips by the return springs of the clamping ring, holding the wafer between the clips and the clamping ring. The clamping action does not involve any rolling or sliding contact between the clips and the wafer, but only relative motion normal to the wafer surface at the moment contact between the clips and the wafer is made or broken and while contact is maintained.

Further in accordance with the present invention, each of the clips of the holder is fixed to a disk of magnetic material, which is maintained in position and kept from being unintentionally moved by a magnet in the latch assembly. The magnet arrangement applies sufficient force to the cooperating elements so that the clips remain in position unless and until they are rotated by the actuator on the holder. As a result, the latch assembly in reliably kept in alignment with the actuator to be engaged by the actuator on the transfer arm.

By eliminating sliding or rolling contact between the wafer and the clips and by reducing sliding contact between other surfaces of the latch assembly, particulate contamination is reduced. In addition, the present invention reduces the likelihood that the wafer will be moved out of alignment on the wafer holder by the clamping action, thus reducing the risk of actuator failure or wafer breakage.

These and other objectives of the present invention will be more readily apparent from the following detailed description of the invention, in which:

DETAILED DESCRIPTION OF THE PREFERRED EMBODIMENT

Figure 1:
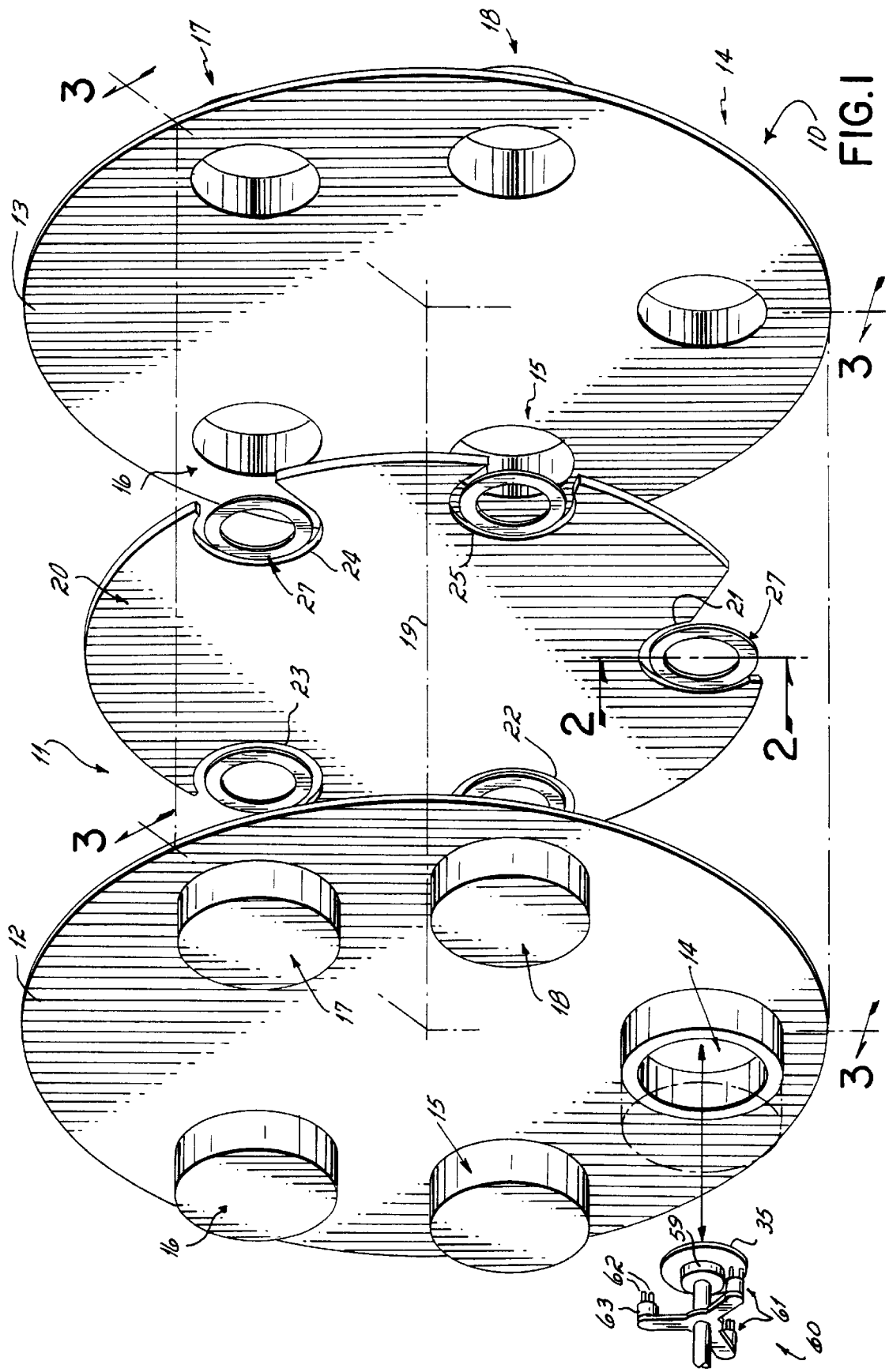
FIG. 1 is an exploded perspective view of a wafer processing machine of a preferred type for use with the present invention.

The present invention is applicable to many types of wafer processing methods and machines such as horizontal cluster tools and other flexible, modular processing machines, but is illustrated herein in one preferred embodiment in a high throughput carrousel type wafer processing machine 10 of the types illustrated and described in U.S. Pat. Nos. 4,915,564 or 5,516,732, both expressly incorporated by reference herein. The machine 10, to facilitate understanding of the invention, is represented by a simplified diagram in FIG. 1. The machine 10 of FIG. 1 includes main vacuum chamber 11, which is in the form of a disc shaped plenum enclosed between two generally circular walls 12 and 13 with a plurality of, for example, five stations 14–18 spaced at even angular intervals around a central horizontal axis 19. Within the chamber 11, mounted for rotary movement on the axis 19, is a circular index plate 20 having five circular openings 21–25 therein equally spaced to simultaneously align with each of the processing stations 14–18.

Figure 2:
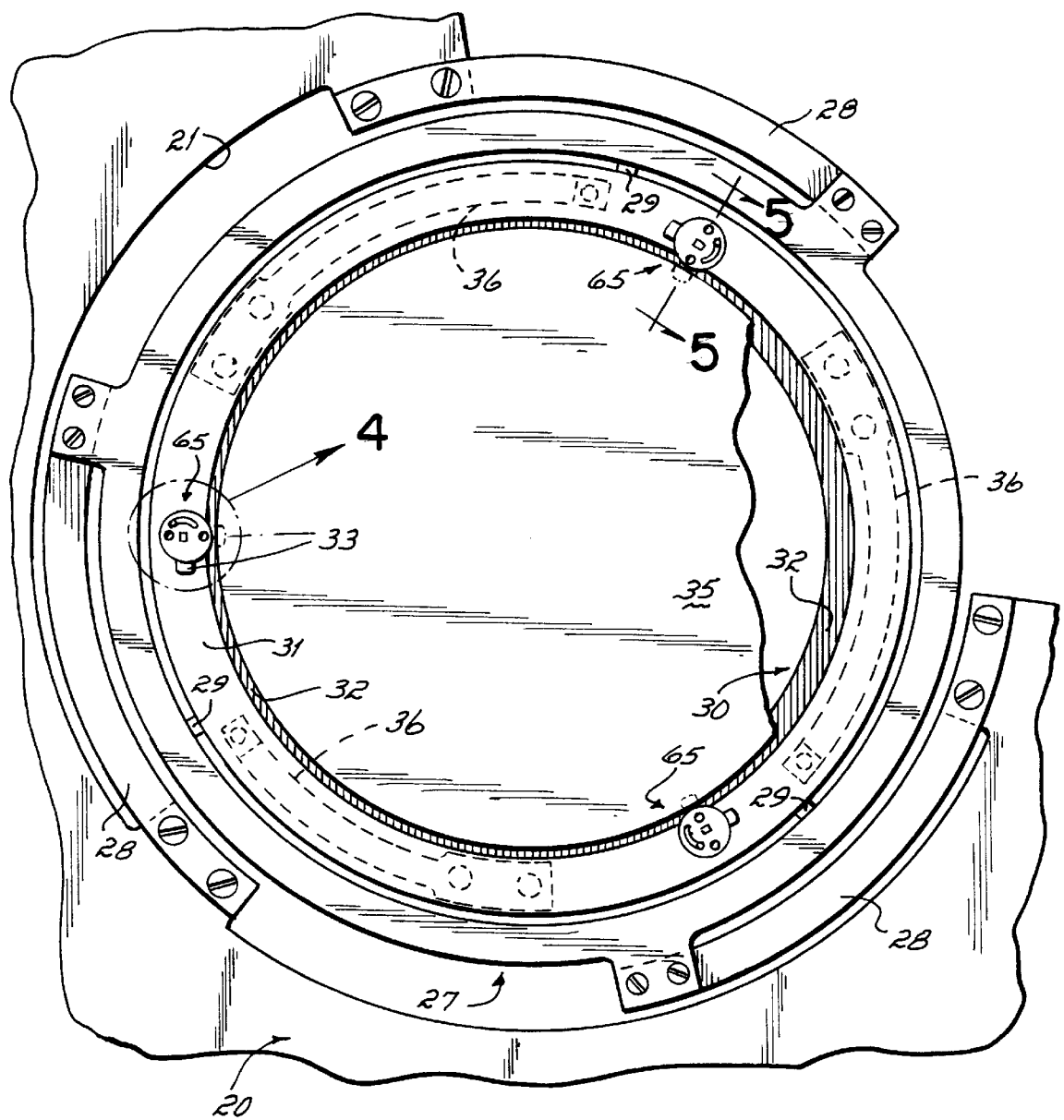
FIG. 2 is an elevational cross-sectional view of a portion of the machine of FIG. 1.

As illustrated in FIG. 2, in each of the openings 21–25 a seal ring 27 is provided, resiliently supported on three equally angularly spaced leaf springs 28 connected to the index plate 20. Within each of the seal rings 27 a wafer holder 30 is provided, rigidly supported on a set of three ceramic insulator pins 29 to the seal ring 20. The wafer holders 30 each carry a wafer 35 through each of the processing stations 14–18 as the plate 20 is angularly indexed by one-fifth revolution, or 72°. At least one of the five stations 14–18, for example station 14, is a loadlock station through which wafers 35 are inserted and removed from the main chamber 11. A remaining three or four of the stations 14–18, for example stations 15–18, are one of any number of types of treatment stations, such as sputter coating or etching stations.

The main structure of each of the wafer holders 30 is a ring shaped annular body 31, typically made of aluminum. The body 31 has a clamp ring 32 resiliently attached to the holder body 31 and biased against the body by a set of three equally angularly spaced leaf springs 36. The clamp ring 32 has an inner diameter slightly less than a wafer 35 that is to be clamped. Wafer 35 is held in the opening of the holder body 31 by the clamp ring 32, which over lies the rim of the wafer 35. The springs 36 press the ring 32 and wafer 35 against a set of three latch clips 33, one of each of three latch assemblies, that are equally angularly spaced around the holder body 31.

Figure 3:
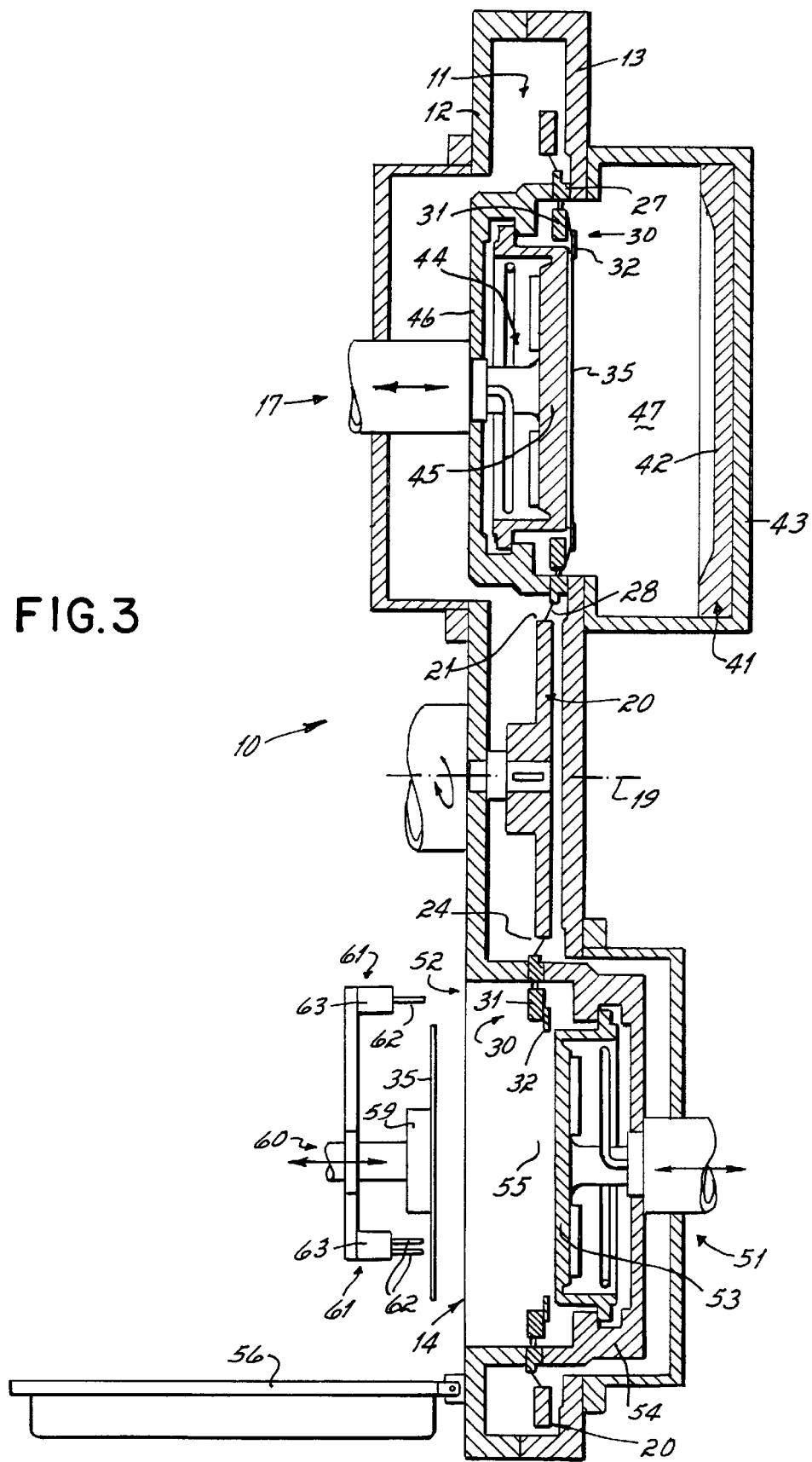
FIG. 3 is an elevational cross sectional view taken along the line 3—3 of FIG. 1.

The cross-sectional view of FIG. 3 through a loadlock station 14 and through a processing station 17 better illustrates the functions and general structure of a wafer holders 30 for purposes of describing features of the present invention. The processing station 17 is divided into two parts, a frontplane section 41, which may be stationary and may typically include processing elements such as a sputtering cathode and target assembly 42 enclosed within a fixed cup shaped chamber wall 43, and a backplane section 44, which may typically include a backplane heat exchanger 45 enclosed within a moveable cup shaped chamber cover 46.

When a wafer 35 is moved into the chamber 17 for processing, the chamber cover 46 is actuated to move rightwardly as viewed in FIG. 3 into contact with the sealing ring 27, deflecting it against the back wall 13 of the chamber 11, and forming a sealed processing chamber 47 that is isolated form the main chamber 11. As the cover 46 moves into sealing position, the backplane heat exchanger 45 moves into contact with the backside of a wafer 35 in the holder 30. This contact is feasible in part because of the open center of the body 31. The wafer 35 remains clamped between the ring 32 and the clips 33, enabling the heat exchanger 45 to effectively contact the back of the wafer 35.

The loadlock station 14 is also divided into two parts, a frontplane section 51 and a backplane section 52. Such a loadlock station 14 is typically equipped with a preheating element, or soft etch equipment, or some other structure for carrying out a cleaning or preprocessing operation. The illustrated frontplane section 51, for example, contains a frontplane heater 53. The frontplane section includes a moveable cup shaped closure 54, which is actuated in a manner similar to the backplane cover 46 of the processing chamber 17, to force the seal ring 27 against the front wall 12 of the chamber 11 to form a sealed loadlock chamber 55 at the loadlock station 14. The backplane section 52 includes a loadlock door 56. The door 56 provides access for a wafer 35, carried by a vacuum chuck 59 of a transfer or load arm 60.

The load arm 60 operates to translate the wafer 35, device side first, into the loadlock chamber 55, through the opening in the holder body 31, to bring outer rim of the wafer 35 into contact with the underside of the clamping ring 32, which, at the loadlock station 14, is free to move against the resistance of the leaf springs 36 away (rightwardly as viewed in FIG. 3) from the body 31 of the holder 30. Insertion of the wafer 35 into the holder 30 is carried out with the latch clips 33 rotated out of the path of the wafer 35. Rotation of the latch clips 33 into and out of position behind the wafer 35 is accomplished by three latch actuators 61 carried by the transfer or load arm 60. The latch actuators 61 each include a pair of actuator pins 62 on the shaft of a pneumatically actuatable rotary cylinder 63, which, when the pins 62 are in engagement with a corresponding one of three latching mechanisms 65 on the holder 30, rotate 90° in one direction to simultaneously move the three clips 33 into a latching position behind the wafer 35, and 90° in the opposite direction to move the clips 33 to a release position in the holder beyond the rim of the wafer 35. One of the latching mechanisms 65 is illustrated in the release position in FIG. 4 and in the latching position in FIG. 4A, and in more detail in FIG. 5.

Figure 4:
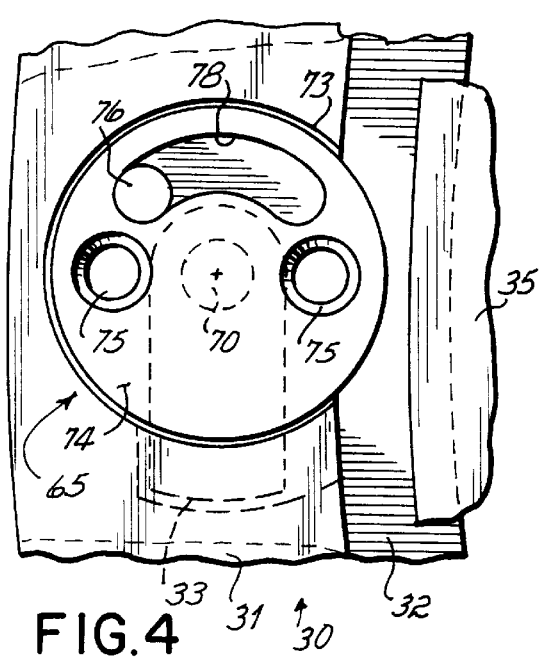
FIG. 4 is an enlarged view of a portion of FIG. 2 illustrating a wafer holder latch mechanism in a released condition.
Figure 4A:
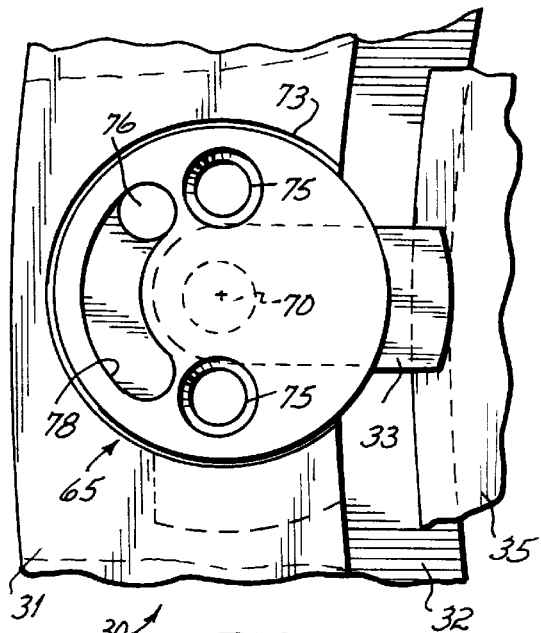
FIG. 4A is an enlarged view, similar to FIG. 4, but illustrating the wafer holder latch mechanism in a latched condition.
Figure 5:
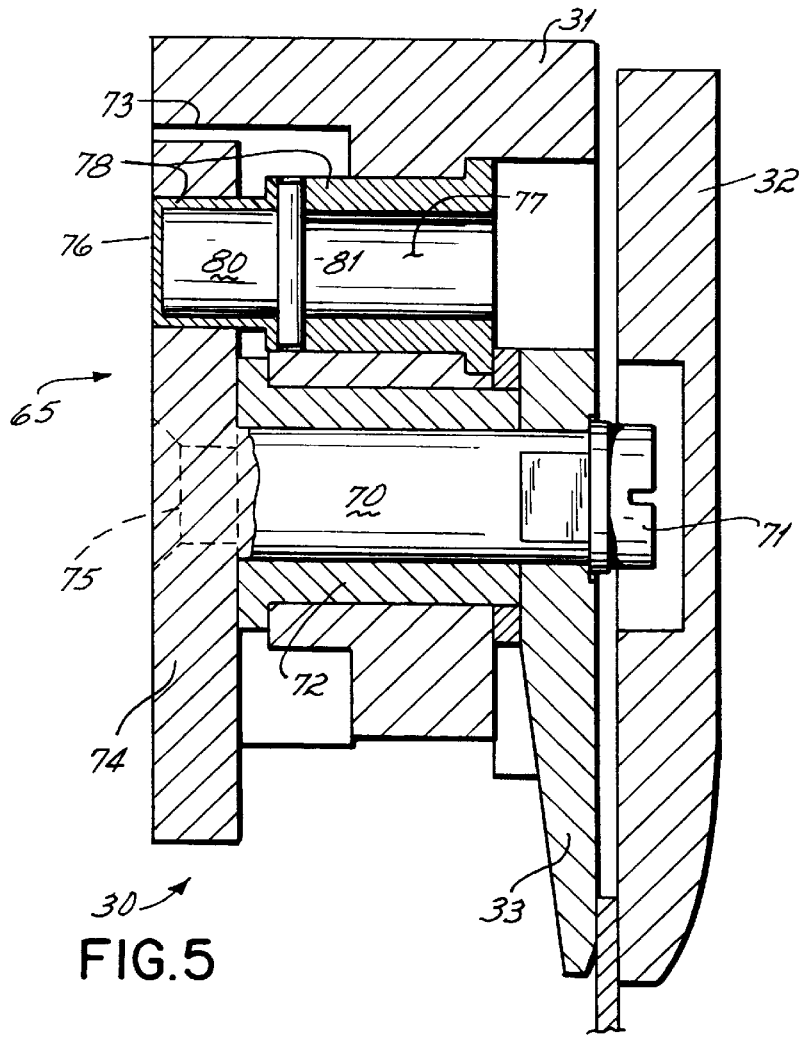
FIG. 5 is a cross-sectional view of a latch mechanism along the line 5—5 of FIG. 2.

Referring to FIGS. 4, 4A and 5, each latching mechanism 65 includes one of the latch clips 33, which is fixed at one end thereof to one end of a pivot shaft 70 by a locking screw 71. The shaft 70 is rotatably supported in a bearing 72 that extends through the body 31 of the holder 30. At the opposite end of the shaft 70 from the clip 33, the shaft is rigidly connected to a circular disc 74, which is set in a circular recess 73 in the body 31 of the holder 30. The disc 74 has a pair of holes 75 therein with flared openings at the rearward facing surface of the disc 74. The holes 75 are spaced on opposite sides of the shaft 70, at the same distance therefrom, to receive the pins 62 of the actuator 61, so that rotation of the actuator 61 rotates the disc 74, the shaft 70 and the clip 33 about the axis of the shaft 70.

The rotation of the disc 74 on the shaft 70 is limited to 90° of rotational movement by a stop peg 76 that is captured in a bore 77 in the holder body 31. The peg 76 extends into an arcuate slot 78 in the disc 74. The peg 76 is in the form of a hollow aluminum flanged cylinder having a cylindrical bore therein in which is carried a small magnet 80, which is held in place by a pin 81. The disc 74 is formed of a magnetic stainless steel material. Magnetic forces are produced between the magnet 80 and the disc 74, which hold the latch assembly in place except when it is being rotated positively by the pins 62 of the actuator 61.

When a wafer 35 is loaded into the loadlock 14, it is held on the transfer arm 60 by, for example, vacuum chuck 59. The wafer 35 is moved by the transfer arm 60 through the open access door 56 into the loadlock chamber 14. The loading of the wafer 35 occurs when no other wafer 35 is in the holder 30 in the loadlock station 14, and with the latches 65 rotated to the unlatched positions with the clips 33 out of the path of the wafer 35 being loaded, which is the position as illustrated in FIG. 4. In loading the wafer 35 onto the holder 30, the load arm 60 moves the wafer 35 against the clamping ring 32, causing the ring 32 to move (rightwardly as viewed in FIG. 3) against the force of the leaf springs 36 away from the holder body 31. The ring 32 is displaced enough by the force exerted between it and the load arm 60 to move the wafer 35 relative to the holder 30 sufficiently beyond the plane of the clips 33 to insure that the clips 33 will reliably clear the wafer 35 when the clips 33 are rotated. The movement of the wafer 35 beyond the plane of the clips 33 is preferably at least about 0.030 inches, and is preferably about 0.040 inches or more, and at least an amount sufficient, allowing for the thickness of the wafer 35, to reliably clear the clips 33 when they are moved. The springs 36 apply sufficient force to only insure that the wafer 35 will be sufficiently clamped to the holder 30, with the force at maximum deflection of the ring 31 being sufficiently light to avoid damage to the wafer 35.

As the load arm moves the wafer 35 to this position on the holder 30, the actuator pins 62, which are aligned with the holes 75 in the disc 74, enter the holes 74. When the ring 31 has moved so that the sufficient clearance is reliably achieved and the pins 62 are in the holes 75, the actuator 61 rotates the pins 62, which rotates the disc 74, thereby rotating the clips 33 into the opening in the body 31 of the holder 30, behind the wafer 35, as illustrated in FIG. 4A. Then, the load arm 60 is retracted from the loadlock chamber 55, releasing the clamp ring 31, which moves against the wafer 35 holding it in position against the clips 33.

During the cycling of a wafer 35 from the loadlock station 14 through the processing chambers at processing stations 15–18 of the machine 10 and back to the loadlock station 14, the magnet 85 holds the discs 74 and clips 33 in place so that they will be in alignment with the pins 62 of the actuators 61 upon return to the loadlock station 14. When the wafer 35 is returned to the loadlock station 14 for unloading, the loadlock is vented to atmosphere and the door 56 to the loadlock chamber 55 is opened, whereupon the disc 74 will be oriented as in FIG. 4A, with the holes 75 in alignment with the pins 62 of the actuator 61. The pins 75 will have been maintained by the machine controller (not shown) in the correct orientation to engage the holes 75 of the disc 74 of a latch in the latched condition. With the clips 33 in latched condition, the load arm 60 moves the empty chuck 59 against the wafer 35 on the holder 30 to push the wafer 35 against the clamping ring 32 to lift the ring 32 away from the holder body 31 and the wafer 35 away from the clips 33. The pins 62 of the actuator 61 thereupon simultaneously engage the holes 75 of the disc 74, and the actuators 61 rotate the clips 33 to their release or retracted positions illustrated in FIG. 4. Then, the chuck 59 engages the wafer 35 and the wafer 35 is withdrawn from the chamber by the load arm 60. Withdrawal of the wafer 35 allows the clamping ring 32 to be returned by the springs 36 to bear against the body 31 of the holder 30.

Those skilled in the art will appreciate that the applications of the present invention herein are varied, and that the invention is described in preferred embodiments Accordingly, additions and modifications can be made without departing from the principles of the invention.

What is claimed is:

1. A method of clamping a wafer for vacuum processing comprising the steps of:

providing a plurality of wafer clips positioned outwardly in a retracted position in a common plane on the backside of a wafer holder of a loading station of a wafer processing machine; then translating, with a load arm and relative to the plane, a wafer, front side first, relative to the holder, from the back side of the wafer holder forwardly through and beyond the plane and contacting a spring biased peripheral clamping ring, which is resiliently connected to the holder, to relatively displace the ring away from the holder; then moving the clips inwardly in the plane to an extended position behind the backside of the wafer; then releasing the wafer from the load arm and withdrawing the load arm rearwardly to allow the spring biased peripheral clamping ring to move toward the plane and clamp the wafer against the extended clips.

2. The method of claim 1 further comprising the steps of:

translating, the load arm from the back side of the wafer holder against the wafer held in the holder and moving the wafer forward against the force of the spring biased peripheral clamping ring to displace the ring away from the holder and move the wafer away from the clips; then moving the clips outwardly in the plane to the retracted position; then withdrawing the load arm rearwardly and removing the wafer from the loading station, backside first.

3. The method of claim 1 wherein the moving step includes the steps of:

engaging the clips with actuators on the load arm and rotating the actuators to pivot the clips.

4. The method of claim 1 further comprising the step of:

magnetically impeding the movement of the clips to prevent movement thereof except when engaged by actuators.

5. A wafer processing apparatus comprising:

a load chamber;

a wafer holder within the chamber having a backside and a front side;

a rearwardly biased clamping member resiliently connected to the front side of the holder;

a plurality of at least three wafer retainer clips moveably mounted to the backside of the holder, spaced around the holder and lying in a plane on the backside of the holder;

a load arm having a wafer chuck thereon and relatively moveable through the plane to relatively move a wafer held in the chuck, front side first, in a path through the center of the holder to a forward position at which the wafer is in non-sliding contact with the clamping member and is a spaced distance forward of the plane, and at which the clamping member is spaced from and resiliently biased rearwardly toward the holder; and the clips being moveable in the plane between an inwardly extended position in the path of the wafer and an outwardly retracted position out of the path of the wafer.

6. The apparatus of claim 5 further comprising:

a plurality of magnets, one situated with respect to each clip to exert a rotation inhibiting force between the clip and the holder.

7. The apparatus of claim 5 further comprising:

latch actuators mounted on the load arm so as to couple to the clips when the load arm is in its forward position and operable to move the clips to their retracted positions when a wafer is being removed from the holder by the load arm and to move the clips to their extended position when a wafer is being loaded to the holder from the load arm.

8. A wafer processing apparatus comprising:

a load chamber;

a wafer holder within the chamber having a backside, a front side and an open center;

a rearwardly biased clamping member resiliently connected to the front side of the holder;

a plurality of at least three wafer latches spaced around the holder, each latch having a retainer clip moveably mounted to the backside of the holder, lying in a common plane and rotatable in the plane about an axis perpendicular to the plane;

a load arm having a wafer chuck thereon and relatively moveable perpendicular to the plane in a path through the center of the holder between a rearward position on the backside of the holder outside of the load chamber and a forward position at which a wafer held in the chuck is in contact with the clamping member and is a spaced distance forward of the plane and at which the clamping member is spaced forward of the holder and is resiliently biased rearwardly against the wafer;

a plurality of latch actuators supported on the load arm, one corresponding to and aligned with each of the latches, the actuators being relatively moveable into and out of coupling engagement with the latches when the load arm moves respectively to its forward and rearward positions, and the actuators being rotatable, when coupled to the latches, to move the clips in the plane, without contacting the wafer when the load arm is in its forward position, between an inwardly extended condition in the path of the wafer and to an outwardly retracted condition out of the path of the wafer.

9. The apparatus of claim 8 wherein:

each latch includes a magnet situated to exert a holding force between the latch and the holder to prevent rotation of the clips when the actuators are uncoupled from the latches.

10. The apparatus of claim 8 wherein:

each latch has a plurality of recesses therein and each actuator has a corresponding plurality of pins thereon configured and located so as to couple to a latch upon movement of the load arm to its forward position.

* * * * *